United States Patent [19]
Raeder et al.

[11] Patent Number: 6,057,068
[45] Date of Patent: May 2, 2000

[54] METHOD FOR DETERMINING THE EFFICIENCY OF A PLANARIZATION PROCESS

[75] Inventors: Christopher H. Raeder; Thomas Brown, both of Austin, Tex.; Peter A. Burke, Newark, Del.

[73] Assignee: Advanced Micro Devices, Inc., Austin, Tex.

[21] Appl. No.: 09/205,483

[22] Filed: Dec. 4, 1998

[51] Int. Cl.⁷ ........................................................ G03F 9/00
[52] U.S. Cl. .............................. 430/30; 382/145; 382/149
[58] Field of Search ............................... 430/30; 382/145, 382/149

*Primary Examiner*—Christopher G. Young
*Attorney, Agent, or Firm*—Williams, Morgan & Amerson

[57] ABSTRACT

A method for measuring the planarization efficiency of a planarization process and a device for use with the method are provided. The device may be a substrate having a set of isolated features, such as trenches or hills, with different widths. In the method, a removable layer of material is formed over the substrate. The substrate features form corresponding features in the removable layer with varying dimensions. A pre-planarization thickness of the removable layer of material is measured at each feature and at one or more of isolation areas. The removable layer of material is then planarized using a planarization process associated with one or more process parameters. A post-planarization thickness of the removable is measured at each feature and at one or more of the isolation regions. The planarization efficiency of the planarization process is then determined as a function of the dimensions of the substrate features or corresponding features in the removable layers and/or one or more process parameters. The determined planarization efficiency may be output by, for example, generating a graph of the planarization efficiency or using the planarization efficiency to change one or more parameters of the planarization process.

10 Claims, 4 Drawing Sheets

METHOD FOR DETERMINING THE EFFICIENCY OF A PLANARIZATION PROCESS

FIELD OF THE INVENTION

The present invention relates generally to the planarization of semi-conductor wafers and, more specifically, to devices, methods and systems for determining the efficiency of a planarization process.

BACKGROUND OF THE INVENTION

The fabrication of semiconductor devices involves the formation of a number of different layers over a semiconductor substrate or wafer. The various layers include conductive layers, such as doped polysilicon or metal layers, and dielectric layers which are used to insulate the conductive layers. One important step in fabricating a device is polishing or planarization. Planarization or planarizing generally involves removing material from a layer in order to provide the layer with a more level or planar surface. The need for planarity stems from subsequent processes, such as photolithography, the results of which are highly dependent upon the planarity of the wafer.

A number of different techniques may be used to planarize wafers. One common technique for planarizing silicon dioxide as well as other types of surfaces on semiconductor wafers is chemical-mechanical polishing (CMP). Chemical mechanical polishing typically utilizes an abrasive slurry disbursed in an alkaline or acidic solution to planarize the surface of the wafer through a combination of mechanical and chemical action. One type of chemical mechanical polishing (CMP) system includes a rotatable circular platen or table on which a polishing pad is mounted. A single or multi-head polishing device is positioned above the table. The polishing device has a single or multiple rotating carrier heads to which wafers can be secured typically through the use of vacuum pressure. In use, the platen is rotated and an abrasive slurry is disbursed onto the polishing pad of the platen. Once the slurry has been applied to the polishing pad, the rotating carrier heads move downward to press their corresponding wafers against the polishing pad. As a wafer is pressed against the polishing pad, the surface of the wafer is mechanically and chemically planarized.

The surface of the layer being planarized is generally associated with hills and valleys depending on the underlying topography. The goal of planarization is to level this surface by removing material forming the hills. The effectiveness or efficiency of a planarization process is typically a function of process parameters, such as the downforces on the polishing arms, the polishing table speed, the polishing time, the pad, and the slurry, and the width and depth of the valleys.

Conventional techniques for measuring the efficiency of a planarization process generally use a substrate having patterned metal lines. In these techniques, a layer of metal is deposited over a substrate, patterned with a photoresist mask and then etched to form isolated metal lines of varying width. A layer of silicon dioxide is then formed over the patterned metal lines. Due to the metal line features, the silicon dioxide layer will include hills over the metal lines and valleys in between metal lines. The thickness of the silicon dioxide is measured in the hills and valleys. The silicon dioxide layer is then polished and the post-polish thickness of the silicon dioxide layer is measured. The planarization efficiency ($P_{eff}$) of the process may then be calculated using the relationship:

$$P_{eff} = 1 - \frac{R_{valley}}{R_{hill}} \quad [1]$$

where $R_{valley}$ is the removal amount or rate in the valleys and $R_{hill}$ is the removal amount or rate in the hills. As it is generally desired to remove material only from the hills and as little material as possible from the valleys, higher values of $P_{eff}$ signify better planarization efficiency. While conventional techniques can provide a measure of planarization efficiency, manufacturers continue to search for techniques which provide more accurate planarization efficiency measurement, reduce the expense of planarization efficiency measurement and/or the time needed to perform the measurement.

SUMMARY OF THE INVENTION

The present invention generally provides devices for use in measuring the planarization efficiency of a planarization process and methods and systems which perform the measurement using the device. In accordance with one embodiment of the invention, a device for measuring the planarization efficiency of a planarization process is provided. The device includes a substrate and a set of isolated features, such as trenches or hills, defined by the substrate and having different widths. The features are each surrounded by isolation areas which are defined by surface portions of the substrate.

A method of manufacturing a device for measuring the efficiency of a planarization process is provided in accordance with another embodiment of the invention. The method includes selectively masking a substrate to expose portions of the substrate and cover other portions of the substrate. The exposed portions of the substrate are then removed to form a set of isolated features (e.g., trenches or hills) from the substrate. Each of the features has a different width.

In accordance with a further embodiment of the invention, a method of measuring the efficiency of a planarization process as provided. The method includes providing a substrate defining isolated features with varying dimensions surrounded by isolation areas. A removable layer of material is formed over the substrate. The substrate features form corresponding features in the removable layer with varying dimensions. A pre-planarization thickness of the removable layer of material is measured at each feature and at one or more of the isolation areas. The removable layer of material is then planarized using a planarization process associated with one or more process parameters. A post-planarization thickness of the removable layer is measured at each feature and at one or more of the isolation regions. The planarization efficiency of the planarization process is then determined as a function of feature dimensions and/or one or more process parameters. The determined planarization efficiency may be output by, for example, generating a graph of the planarization efficiency or using the planarization efficiency to change one or more parameters of the planarization process.

The above summary of the present invention is not intended to describe each illustrated embodiment or implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
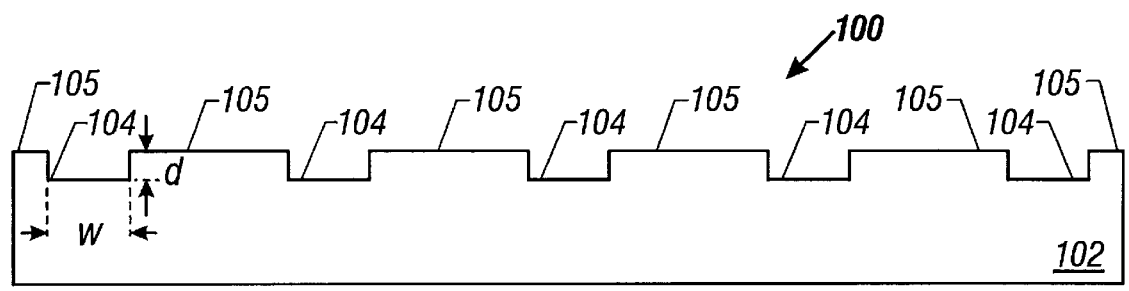
FIG. 1 illustrates an exemplary substrate portion in accordance with an embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a number of types of systems for planarizing semiconductor wafers. Such systems include single and multi-arm polishing tools, for example. While the present invention is not so limited, an appreciation of various aspects of the invention will be gained through the discussion below.

With reference to FIG. 1, an exemplary device for use in measuring the planarization efficiency of a planarization process will be described. The device 100 generally includes one or more substrates 102 in which a plurality of isolated trenches 104 have been defined. The substrate(s) are typically formed of a semiconductor material, such as silicon. The trenches 104 have varying dimensions and are surrounded by isolation areas 105. A layer suitable for planarization removal, such as an oxide layer, will be formed over the trenches 104. The trenches 104 will be used to form valleys in the removable layer so that planarization efficiency of a planarization process may be measured. The isolation areas 105 are typically sufficiently wide to provide the removable layer with a uniform thickness over a portion of each isolation area For many applications, suitable widths of the isolation areas 105 range from 8 to 20 mm.

The trench dimensions which vary and are important include the width w and depth d of the trenches 104. The length of the trenches 104 can vary or be constant from trench to trench. The manner in which the trench dimensions differ can vary as well. The trenches 104 may, for example, have different widths and the same depth, different depths and the same width, or different depths and different widths. In one embodiment, the device 100 includes a single substrate 102 having trenches with the same depth and different widths. The widths may, for example, range from 0.1 mm to 1 cm in increments of 0.1 to 0.2 mm, for example. In another embodiment, the device 100 includes a single substrate 102 with multiple sets of trenches, the trenches within each set having the same depth and varying widths. In this embodiment, each trench set may cover the same spectrum of widths at a different depth so as to provide a spectrum of depths as well. In yet another embodiment, the device 100 includes multiple substrates 102 each of which include a set of trenches of varying widths and common depth with the depth differing between substrates 102. As above, each trench set may cover the same spectrum of widths at different depths.

As noted above, the trenches will be used to create valleys in a subsequently-formed removable layer. The valleys can then be planarized to determine the planarization efficiency of the planarization process as a function of one or more dimensions of the valleys (e.g., width and/or depth) or one or more dimensions of the trenches. The trench dimensions as well as the number of trenches may be suitably selected in consideration of the desired breadth and resolution of the spectrum(s) over which the planarization efficiency versus valley or trench dimension(s) is desired.

Figure 2A:
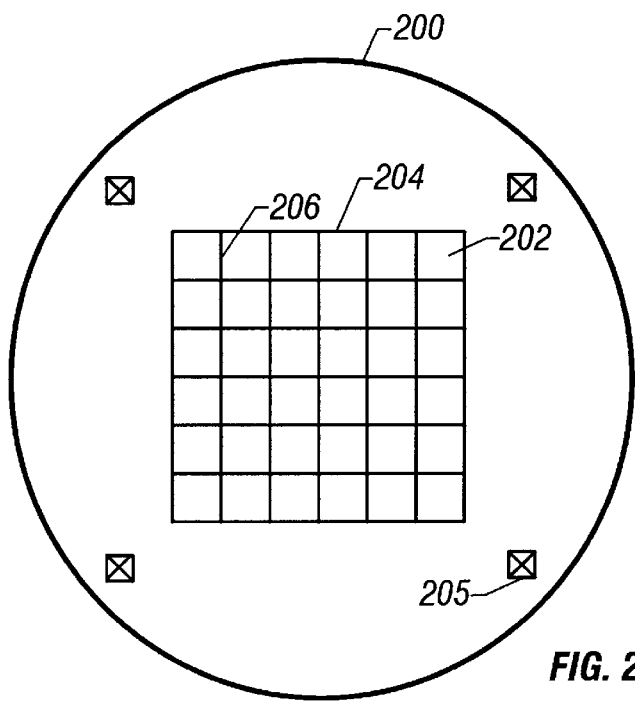
FIGS. 2A and 2B illustrate an exemplary substrate in accordance with another embodiment of the invention.
Figure 2B:
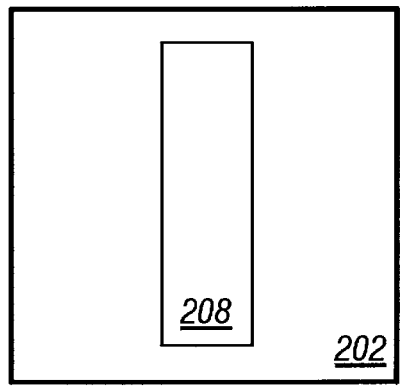

FIGS. 2A and 2B illustrates another exemplary device for measuring the planarization efficiency of a planarization process. The device includes a substrate 200 having a plurality of die 202 separated by horizontal and vertical scribe lines 204 and 206. The substrate 200 may further include alignment marks 205 readable by a metrology tool for aligning the tool with a desired location on the substrate 200. Within each die 202, a single trench is formed. Alternatively, a plurality of trenches may be formed in each die 202. An enlarged view of a die 202 with a trench 208 is illustrated in FIG. 2B. Each die 202 is associated with a trench having a different dimension, such as a different width. In the exemplary embodiment, a 6×6 matrix of die 202 is illustrated. The width of the 36 different trenches may range, in increments, from 0.1 mm to 1 cm for many applications.

The trenched substrate 200 may be formed in a number of manners. For instance, the substrate 200 may be formed by forming a layer of photoresist over the substrate 200, aligning a photolithography stepper with a die 202 and exposing the photoresist over the die 202 with a reticle pattern defining a trench. The substrate 200 may then be stepped to expose another die with a different reticle pattern which defines a trench with a different width and so forth. After stepping, the photoresist layer may then be developed to selectively expose the substrate 200. The substrate 200 may then be etched using known techniques to form a plurality of trenches in the substrate each having a different width and the same depth. To form trenches with varying depths, portions of the substrate may be selectively masked while etching.

The above devices for measuring planarization efficiency provide significant advantages over conventional techniques. For instance, forming trenches in a substrate is much more efficient than forming metal lines over a substrate. Thus, the above devices may be more easily fabricated than conventional devices which are currently used for determining planarization efficiency. In addition, a typical wafer includes large regions of densely packed metal lines separated by or adjacent to open spaces. The invention recognizes that, from a planarization perspective, the densely packed metal line regions appear as relatively flat, uniform surfaces and the open spaces appear as depressions. The above devices thus more accurately model a production wafer by providing trenches which represent the depressed open areas and relatively large isolation areas surrounding and between the trenches which represent the raised densely packed metal line regions. In contrast, conventional substrates for determining planarization efficiency contain relatively large depressions and narrow, isolated raised features (i.e., the patterned metal lines). Accordingly, the above devices can, for example, provide a more accurate determination of planarization efficiency.

Figure 3:
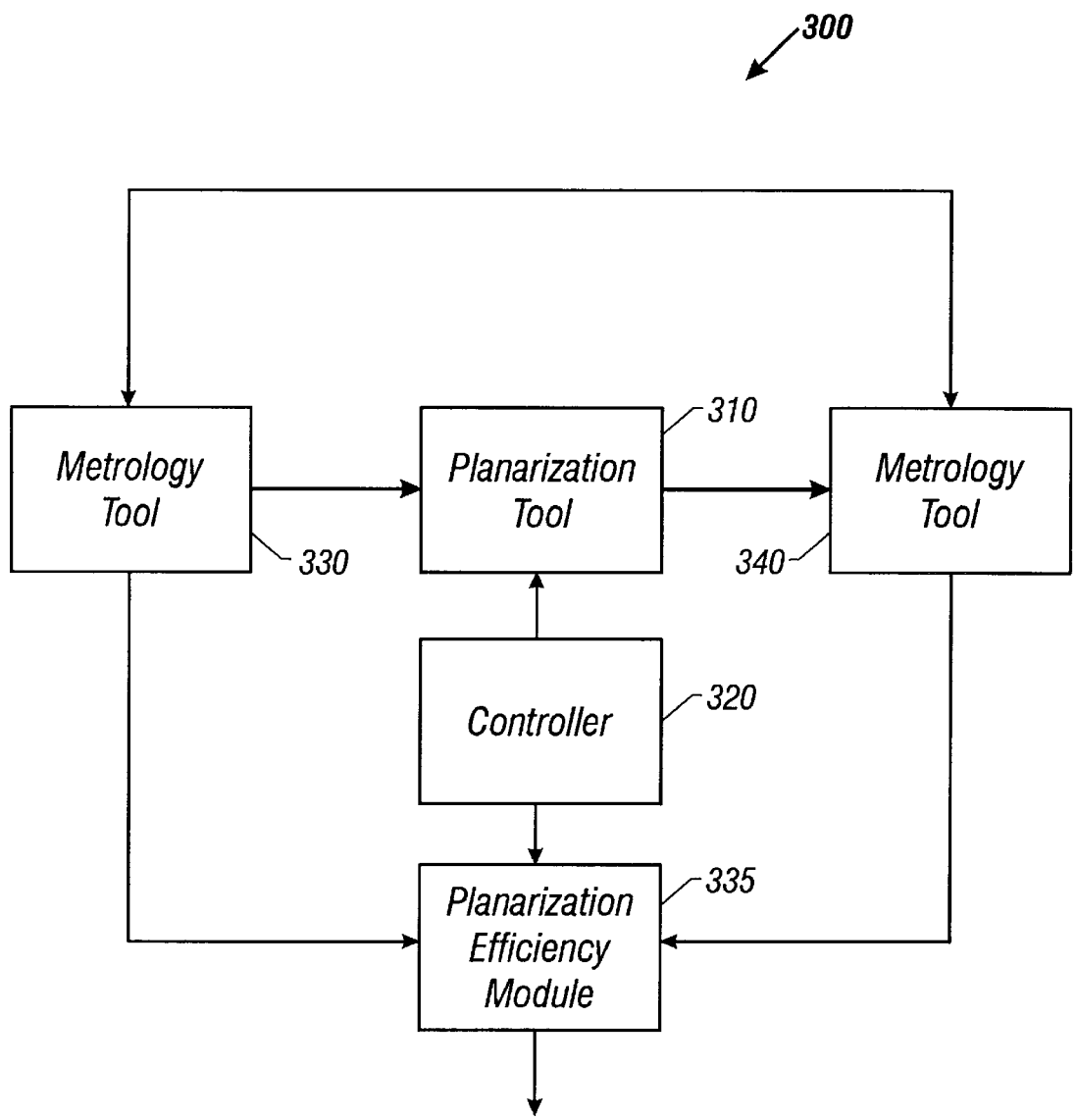
FIG. 3 illustrates and exemplary system for measuring planarization efficiency in accordance with an embodiment of the invention.

FIG. 3 illustrates an exemplary system for measuring the planarization efficiency of a planarization process using the device discussed above. The system 300 generally includes a planarization or polishing tool 310, such as a CMP tool, capable of planarizing semiconductor wafers and a planarization efficiency module 335 for determining the efficiency of the planarization process. A controller 320 is provided for controlling the planarization tool 310. The controller 320 typically outputs control signals to the tool 310 for controlling one or more process parameters of the planarization process, including, for example, arm downforces, table speed, and removal time. The controller 320 may also provide the outputs to the module 335. While illustrated as functionally separate, the controller 330 and planarization efficiency module 335 may be implemented on the same or different computer systems.

The system 300 further includes metrology tools 330 and 340 for measuring pre- and post-planarization thicknesses of a removable layer in the hills and valleys of the removable layer. While two metrology tools 330 and 340 are illustrated, it should be appreciated that one metrology tool may be used to measure both the pre- and post-planarization thicknesses if desired. The metrology tools 330 and 340 generally measure thicknesses of the removable layer at desired locations on the wafer and provide these measurements to the efficiency module 335. The efficiency module 335 may use the pre- and post-planarization thickness measurements and the valley or trench dimensions to determine the efficiency of the planarization process as a function of the valley or trench dimensions. The efficiency module 335 may also use parameters of the planarization process, such as the slurry, the pad, arm downforces, table speed, etc., to determine planarization efficiency of one or more process parameters.

Figure 4:
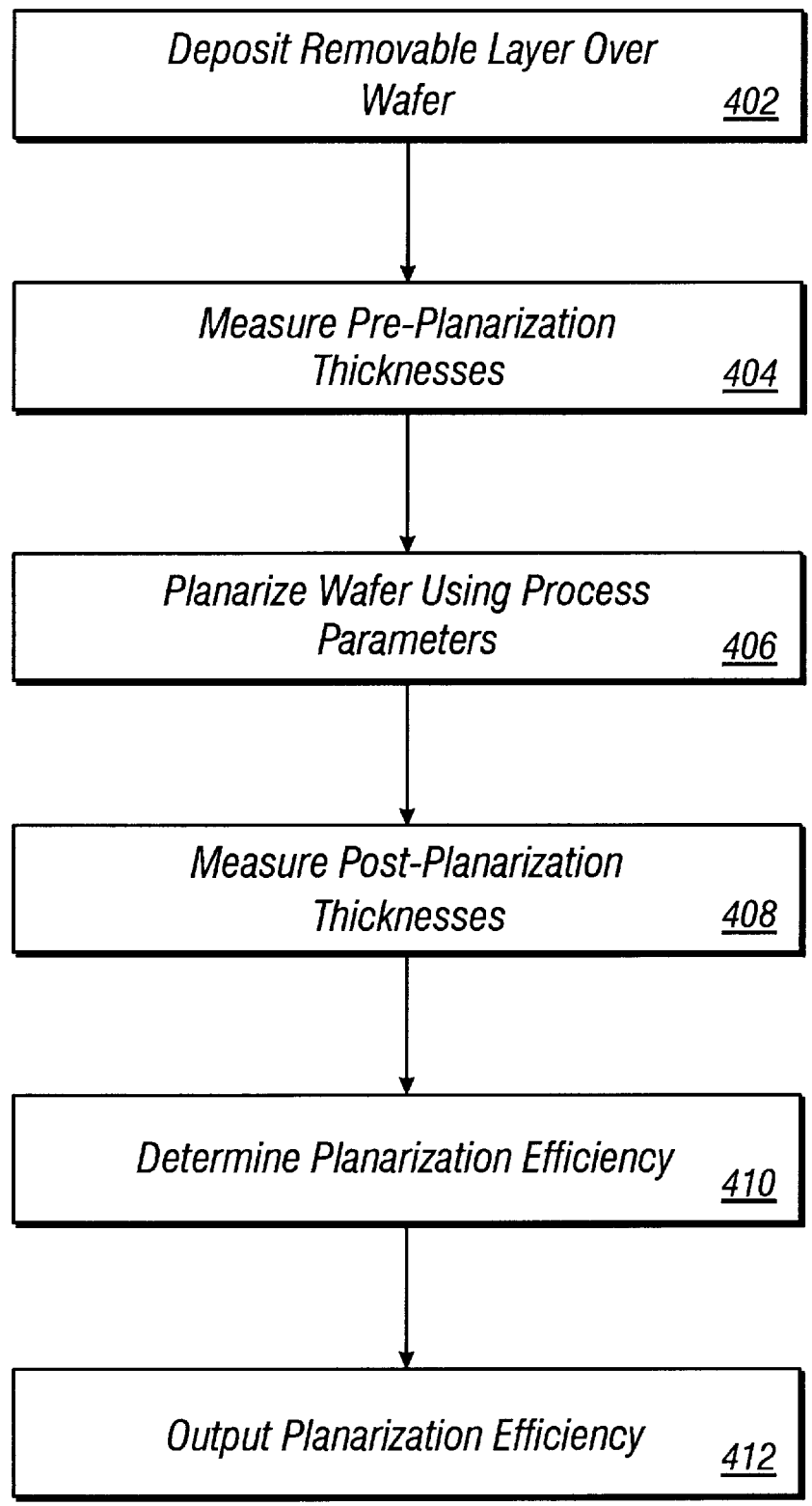
FIG. 4 illustrates an exemplary method for measuring planarization efficiency in accordance with an embodiment of the invention.

FIG. 4 illustrates an exemplary process for determining the planarization efficiency of a planarization process. For ease of illustration and not of limitation, the exemplary process will be described with reference to the system 300 discussed above as well as FIG. 5A and 5B which show cross sections of a semiconductor wafer during the planarization efficiency measurement process. At block 402, a removable layer 502 is formed over a substrate 500 having a plurality of isolated trenches 504 with varying dimensions.

Figure 5A:
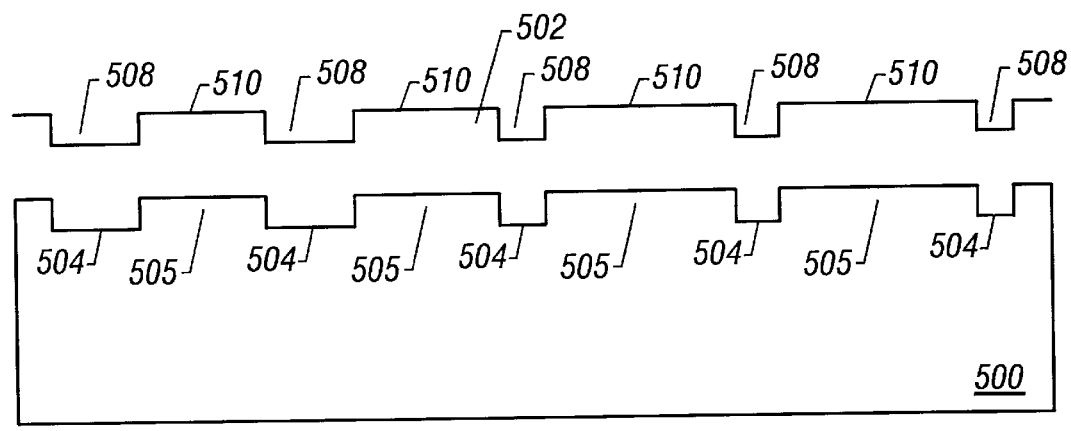
FIGS. 5A and 5B illustrate cross-sections of an exemplary substrate during the method of FIG. 4.

The removable layer 502 may, for example, be an oxide such as silicon dioxide, formed using known deposition techniques. Portions of the removable layer 502 will be removed in order to assess the planarization efficiency of the planarization process. The removable layer 502 is thus typically provided with a thickness which is greater than the amount of material which is to be removed. This thickness may be, but need not be, thicker than the depth of the trenches 504. As illustrated in FIG. 5A, the removable layer 502 generally has a profile similar to the profile of the substrate 500. That is, the removable layer 502 typically includes valleys 508 over the trenches 504 and hills 510 over the isolation areas 505 separating the trenches 504. The width and depth of the valleys generally correspond to the width and depth of the trenches.

The pre-planarization thickness of the removable layer 502 in the hills 510 and the valleys 508 are then measured using the metrology tool 330 as indicated at block 404. Typically, this includes measuring the thickness of the removable layer 502 in each valley 508 (i.e., above each trench 504) and measuring the thickness of the removable layer 502 in at least one representative hill 510 (i.e., above an isolation area). If desired, the hill thickness of the removable layer 502 may be measured over multiple hills 510, including all hills 510, if desired. Advantageously, when measuring each thickness, the metrology tool 330 may reference alignment marks (such as those noted above) or a scribe line to determine the location for the measurement.

Figure 5B:
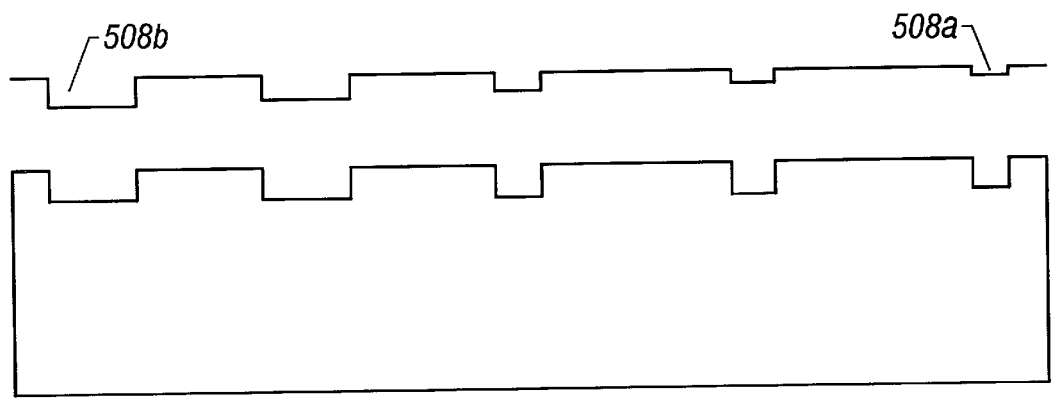

The removable layer 502 is then partially planarized by the planarization tool 310 using the planarization process parameters as indicated at block 406. The resultant structure is shown in FIG. 5B. As should be appreciated, the planarization process parameters may be provided by the controller 320 or otherwise. For example, the type of slurry and the pad are typically controlled by a user and outside of the controller's domain, while other process parameters such as table speed, arm downforces, and removal time are typically provided by the controller 320. The planarization process generally removes material from the hills 510 in a uniform manner, while the removal rate in the valleys 508 will vary with wider valleys having a tendency to remove faster than narrower valleys. As depicted in FIG. 5B, which illustrates a cross section of the wafer after planarization, the narrower valleys (e.g., valley 508a) have a smaller step height after planarization than the larger valleys (e.g., valley 508b).

After planarization, the wafer moves to metrology tool 340 for post-planarization thickness measurements of the removable layer 502 as indicated at block 408. A thickness measurement is typically taken in each valleys 508 as well as in one or more hills 510. As above, the metrology tool 340 may reference scribe lines on the substrate 500 to determine the location for each measurement The post-planarization thickness measurements are provided to the planarization efficiency module 335 for determining the planarization efficiency of the planarization process as a function of the valley or trench dimensions and/or one or more process parameters of the planarization process.

Block 410 represents the determination of the planarization efficiency of the planarization process. As noted above, the planarization efficiency may be determined as a function of the dimensions of the valley or trenches and/or one or more parameters of the planarization process. The valley or trench dimensions (e.g., depth, width, or depth and width) may be measured (e.g., by a metrology tool) prior to planarization and provided to the efficiency module 335. To determine planarization efficiency as a function of the valley or trench dimensions, equation [1] above may be calculated for each valley or trench. For each calculation, the removal value (e.g., rate or amount) for the hill may be the removal value for a representative hill, the removal value for the nearest measured hill, or an average removal value over a number of hills. From these calculations, a spectrum of planarization efficiency versus valley or trench dimension may be determined.

In certain embodiments, the substrate 500 is provided with trenches 504 having different widths and the same depth. In this case, a single run through steps 402–408 can be sufficient to provide a planarization efficiency spectrum as a function of trench or valley width. In accordance with one aspect of the invention, the semiconductor wafer is rerun through steps 404–408 a number of times (without cleaning the substrate 500 of the removable layer) to measure the planarization efficiency as a function of width as well as depth. In this case the step heights or depths of the valleys are used as the varying parameter in at least the subsequent runs. As above, valley step heights may be measured by a metrology tools prior to each planarization of the removable layer 502. As the valley step heights vary with planarization due to different valley widths, planarization efficiency as a function of the valley or trench width as well as depth may be calculated.

As noted above, the planarization efficiency as a function of planarization process parameters may also be determined. This is typically performed by running the wafer through the planarization process a number of times while varying one or more parameters of the process during the runs. In one embodiment, steps 402–408 are repeated with different process parameters and the entire removable layer 502 is removed from the surface of the substrate 500 between runs. Removal of layer 502 may be done using, for example, a selective etching technique. In another embodiment, the removable layer 502 is rerun through the planarization sequence one or more times with different process parameters. The controller 320 may then calculate planarization efficiency as a function of one or more process parameters using the step height of the valleys.

Block 412 represents outputting the determined planarization efficiency. The planarization efficiency may be output in a number of different manners. For example, the planarization efficiency may be stored in a memory arrangement for subsequent use and/or graphically displayed for visual analysis. The planarization efficiency may also be output for use in varying the process parameters for a subsequent planarization process. For instance, based on the determined planarization efficiency as a function of process parameters, optimal process parameters for planarization may be determined and used during actual product runs. In addition, the planarization efficiency as a function of trench or valley dimensions may be used to determine optimum dimensions of features on production wafers.

Using the above process, the planarization efficiency of a planarization process may be measured as a function of trench or valley dimensions and/or process parameters used in the planarization process. The output of this process may be used in a number of different manners in order to enhance the fabrication of semiconductor devices. The above process is also more efficient than conventional processes. For instance, the above process may reuse a trenched substrate a number of times. With conventional techniques, a substrate patterned with metal lines is either discarded after a single use or the patterned metal lines are reformed on the substrate before reuse of the substrate.

While the above embodiments illustrate the use of a substrate(s) with isolated trenches for determining planarization efficiency, the invention is not so limited. In other embodiments, isolated raised features or hills may be defined by one or more substrates and take the place of isolated trenches. Such raised features may, for example, be formed by inverting the masks used to form the trenches discussed above. In this case, the exposed portions of a substrate would be etched to form isolation areas, while covered portions of the substrate would be left intact, thereby defining hills or raised portions (relative to the isolation areas). The raised features may be formed in sets, on one or more substrates, and with varying dimensions similar to the trench features discussed above.

The systems and processes discussed above with respect to FIGS. 3 and 4 may be implemented in a similar fashion when using raised substrate features. In either case, the substrate features (i.e., the isolated trenches or isolated raised substrate portions) would form corresponding features with varying dimensions in a subsequently deposited removable layer. Of course, with raised substrate features, the corresponding features formed in the removable layer would be isolated hills, separated by valleys over isolation areas. The depth of a raised feature of a substrate or removable layer corresponds to the height difference between the feature and the substrate surface or removable layer surface in an adjacent isolation area The pre- and post-planarization thicknesses of the removable layer at each of these features and at one or more of the isolation areas may be measured and used to determine planarization efficiency. Like substrates with isolated trenches, substrates with isolated raised portions may be run through the process depicted in FIG. 4 a single time, multiple times without cleaning off a removable layer, or multiple times each with one or more different process parameters and/or a new removable layer.

Using substrate(s) with raised features provides benefits similar to those noted above with respect to isolated trenches. For instance, both devices may be reused a number of times. In addition, since devices employing raised features may also be formed by simply removing portions of a substrate, they may be more easily fabricated than conventional devices for measuring planarization efficiency. Furthermore, devices with raised features may more accurately assess the planarization efficiency of processes intended to selectively polish raised features on a wafer.

In summary, the present invention is applicable a number of different, methods and apparatuses for measuring the planarization efficiency of a planarization process. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

What is claimed is:

1. A method of measuring the efficiency of a planarization process, comprising:

(a) providing a substrate defining isolated features with varying dimensions separated by isolation areas;

(b) forming a removable layer of material over the substrate, wherein the substrate features form corresponding features in the removable layer with varying dimensions;

(c) measuring a pre-planarization thickness of the removable layer of material at each substrate feature and at one or more of the isolation areas;

(d) planarizing the removable layer of material using the planarization process, the planarization process being associated with one or more process parameters;

(e) measuring a post-planarization thickness of the removable layer of material at each substrate feature and at one or more of the isolation regions;

(f) determining planarization efficiency of the planarization process as a function of one or more process parameters or the dimensions of the substrate features or corresponding removable layer features; and (g) outputting the determined planarization efficiency.

2. The method of claim 1, further including removing the removable layer of material from the substrate and repeating steps (b) through (g) using the same substrate and one or more different process parameters.

3. The method of claim 1, wherein the varying dimensions include one or more of varying widths and varying depths.

4. The method of claim 1, wherein the process parameters include one or more of a pad, a slurry, a rotation speed of the pad, a downforce of a wafer carrier.

5. The method of claim 1, wherein forming the removable layer of material includes depositing an oxide over the substrate.

6. The method of claim 1, wherein determining the planarization efficiency of the planarization process includes calculating, for each substrate feature, a ratio between a removal value of a valley and a removal value of a hill in the removable layer.

7. The method of claim 1, wherein outputting the planarization efficiency includes displaying a graph of the planarization efficiency.

8. The method of claim 1, wherein outputting the planarization efficiency includes storing the planarization efficiency in a memory arrangement.

9. The method of claim 1, wherein outputting the planarization efficiency includes varying one or more process parameters based on the planarization efficiency.

10. The method of claim 1, further including measuring depths of the corresponding features in the removable layer and repeating steps (b) through (g) using the measured depths, wherein determining planarization efficiency include determining planarization efficiency as a function of the depths.

* * * * *